(12) United States Patent
Mizuta (10) Patent No.: US 10,312,285 B2
(45) Date of Patent: Jun. 4, 2019

(54) LED ILLUMINATOR AND METHOD OF MAKING THE SAME

(71) Applicant: ROHM CO., LTD., Kyoto-shi, Kyoto (JP)

(72) Inventor: Shinsei Mizuta, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/276,478

(22) Filed: Sep. 26, 2016

(65) Prior Publication Data
US 2017/0092690 A1  Mar. 30, 2017

(30) Foreign Application Priority Data

Sep. 30, 2015  (JP) ................ 2015-193526

(51) Int. Cl.
| | |
|---|---|
| *H01L 27/15* | (2006.01) |
| *H01L 33/56* | (2010.01) |
| *H01L 33/60* | (2010.01) |
| *H01L 33/62* | (2010.01) |

(52) U.S. Cl.
CPC ............ *H01L 27/153* (2013.01); *H01L 33/56* (2013.01); *H01L 33/60* (2013.01); *H01L 33/62* (2013.01); *H01L 2224/73265* (2013.01); *H01L 2224/8592* (2013.01); *H01L 2933/005* (2013.01); *H01L 2933/0033* (2013.01); *H01L 2933/0058* (2013.01)

(58) Field of Classification Search
CPC .................................................. H01L 27/153
USPC ............................................. 257/89; 438/27
See application file for complete search history.

(56) References Cited

U.S. PATENT DOCUMENTS

| | | | | |
|---|---|---|---|---|
| 2005/0093005 A1* | 5/2005 | Ruhnau | ............... | H01L 31/0203 257/79 |
| 2006/0043387 A1* | 3/2006 | Hata | ................ | H01L 33/20 257/79 |
| 2006/0232969 A1* | 10/2006 | Bogner | ............. | G02F 1/133603 362/249.16 |
| 2008/0012036 A1* | 1/2008 | Loh | ................ | H01L 33/483 257/99 |
| 2010/0327307 A1* | 12/2010 | Ruhnau | ............... | H01L 31/0203 257/98 |
| 2011/0024781 A1* | 2/2011 | Fujimoto | ............. | H01L 33/20 257/98 |
| 2012/0299022 A1* | 11/2012 | Hussell | .............. | H01L 25/0753 257/88 |
| 2013/0043504 A1* | 2/2013 | Kobayakawa | ......... | H01L 33/62 257/99 |

(Continued)

FOREIGN PATENT DOCUMENTS

JP        2014-67846 A    4/2014

*Primary Examiner* — Igwe U Anya
(74) *Attorney, Agent, or Firm* — Hamre, Schumann, Mueller & Larson, P.C.

(57) ABSTRACT

An LED illuminator includes an LED chip and an opaque resin member. The LED chip includes a support substrate, a semiconductor layer disposed on the obverse surface of the support substrate, an electrode formed on the reverse surface of the support substrate. The obverse surface of the support substrate has a peripheral edge portion exposed from the semiconductor layer. The opaque resin member covers at least apart of the side surface of the support substrate while exposing the peripheral edge portion of the obverse surface of the support substrate.

24 Claims, 9 Drawing Sheets

(56) References Cited

U.S. PATENT DOCUMENTS

| | | | |
|---|---|---|---|
| 2013/0169149 A1* | 7/2013 | Sato | H01L 33/60 313/512 |
| 2014/0217433 A1* | 8/2014 | Tudorica | H01L 25/0753 257/89 |
| 2015/0108510 A1* | 4/2015 | Urano | H01L 33/60 257/88 |

* cited by examiner

LED ILLUMINATOR AND METHOD OF MAKING THE SAME

BACKGROUND OF THE INVENTION

1. Field of the Invention

The present invention relates to an LED illuminator including an LED chip as a light source, and also to a method of making an LED illuminator.

2. Description of Related Art

Figure 10:
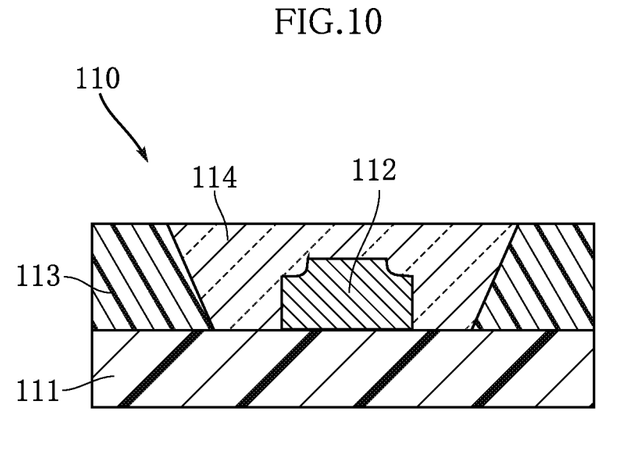
FIG. 10 is a cross-sectional view showing an example of a conventional LED illuminator.

FIG. 10 shows an example of a conventional LED lighting fixture. The LED lighting fixture 110 shown in the figure includes an LED chip 112 mounted on a substrate 111. The LED chip 112 is surrounded by a frame-shaped reflector 113. The space surrounded by the reflector 113 is filled with a sealing resin 114. For the LED lighting fixture, various measures are taken to cause the light from the LED chip 112 to be emitted to the outside as efficiently as possible. For example, the reflectivity of the substrate 111 and reflector 113 is enhanced, and a protective layer covering a wiring pattern formed on the substrate 111 is provided in order to inhibit light absorption due to deterioration of the wiring pattern (see e.g., JP 2014-67846A).

However, part of the light beams that have been emitted from the LED chip 112 and traveled to side surfaces of the LED chip 112 by diffused reflection will be absorbed by the LED chip 112. This inhibits enhancement of the brightness of the LED lighting fixture 110.

SUMMARY OF THE INVENTION

The present invention has been conceived under the above-described circumstances, and aims to provide an LED illuminator capable of achieving enhanced brightness.

According to a first aspect of the invention, there is provided an LED illuminator that includes a first LED chip and an opaque resin member that does not transmit light from the LED chip. The LED chip includes a support substrate, a semiconductor layer and a first electrode. The support substrate has an obverse surface, a reverse surface and a side surface that is located between the obverse surface and the reverse surface. The semiconductor layer is disposed on the obverse surface of the support substrate. The first electrode is formed on the reverse surface of the support substrate. The obverse surface of the support substrate has a peripheral edge portion exposed from the semiconductor layer. The opaque resin member covers at least a part of the side surface of the support substrate and exposing the peripheral edge portion of the obverse surface.

According to a second aspect of the invention, there is provided a method of making an LED illuminator. By the method, the following steps are performed. An LED chip is prepared, which includes a support substrate, a semiconductor layer disposed on an obverse surface of the support substrate, and an electrode formed on a reverse surface of the support substrate, where the obverse surface has a peripheral edge portion exposed from the semiconductor layer. The LED chip is bonded to a base substrate. A reflector is attached to the substrate in a manner such that the reflector surrounds the LED chip. A liquid opaque resin is injected into the space defined by the reflector so as to form an opaque resin member that covers at least a part of a side surface of the support substrate and exposes the peripheral edge portion of the obverse surface.

In an LED illuminator of the invention, light beams traveling toward the side surface of the support substrate are shielded by the opaque resin member. Thus, it is possible to prevent these light beams from being absorbed by the support substrate. Accordingly, the brightness of the LED illuminator is improved.

Other features and advantages of the present invention will become more apparent from the detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
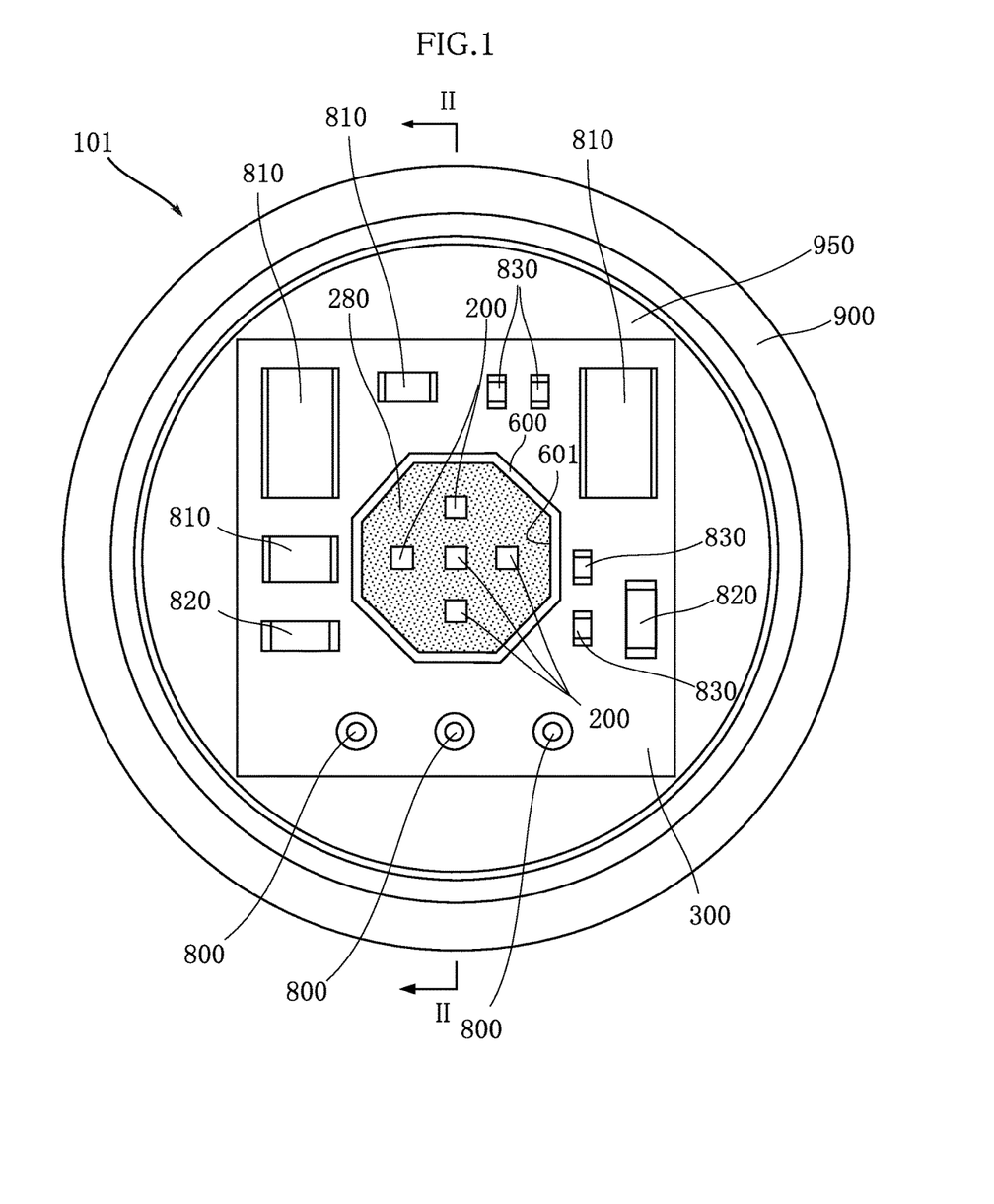
FIG. 1 is a plan view showing an LED illuminator according to a first embodiment of the present invention.
Figure 2:
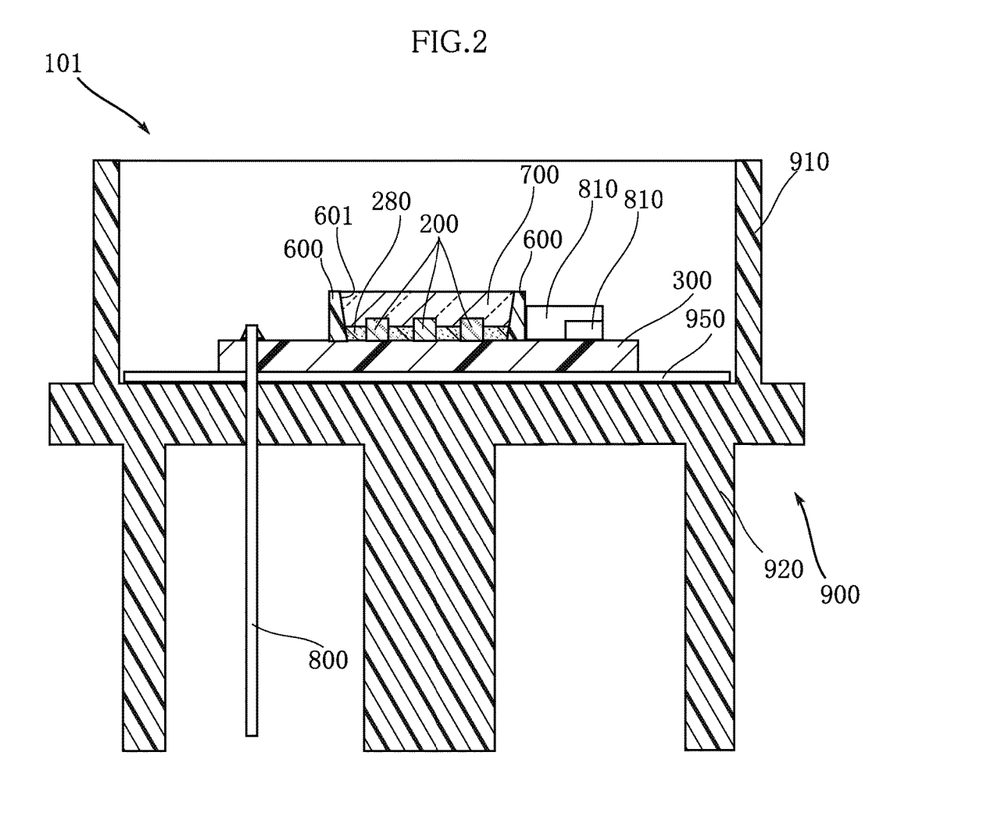
FIG. 2 is a cross-sectional view taken along the line II-II in FIG. 1.
Figure 3:
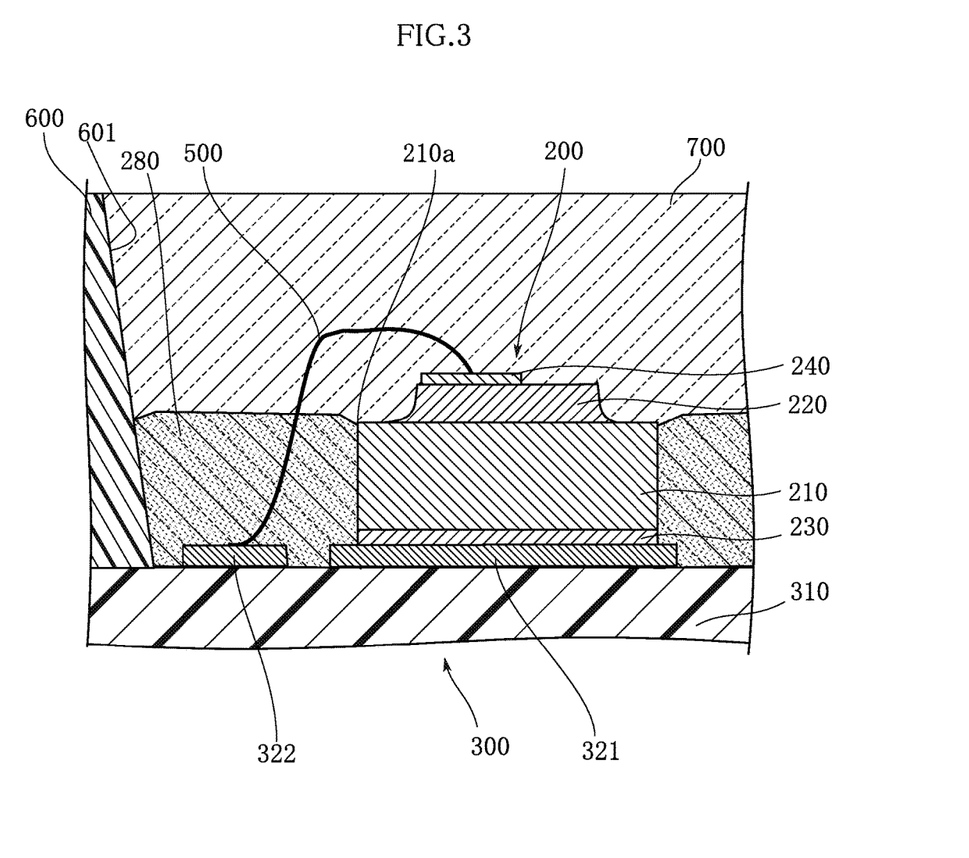
FIG. 3 is an enlarged cross-sectional view showing relevant portions of the LED illuminator shown in FIG. 1.
Figure 4:
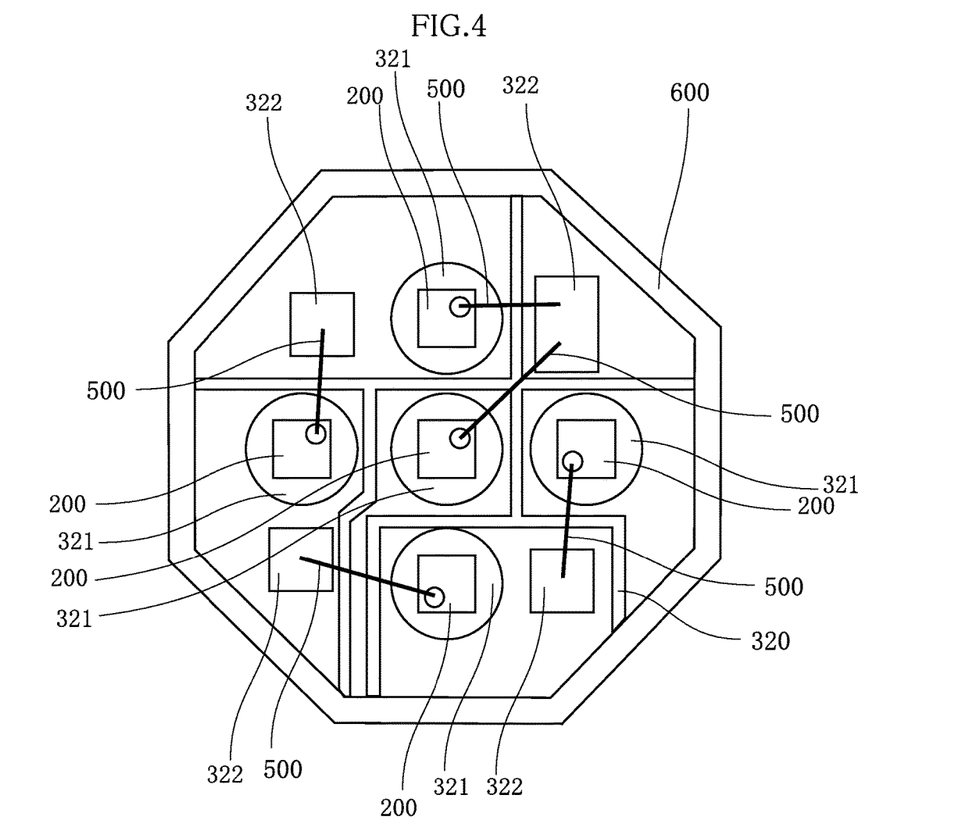
FIG. 4 is an enlarged view showing relevant portions of the LED illuminator shown in FIG. 1.

FIGS. 1 to 4 are diagrams showing an LED illuminator according to a first embodiment of the present invention. FIG. 1 is a plan view showing the LED illuminator. FIG. 2 is a cross-sectional view taken along the line II-II in FIG. 1. FIG. 3 is an enlarged cross-sectional view showing relevant portions of the LED illuminator shown in FIG. 1. FIG. 4 is an enlarged view showing relevant portions of the LED illuminator shown in FIG. 1. An LED illuminator 101 of the present embodiment is, for example, a vehicle-mounted illuminator, and includes a base substrate 300, LED chips 200, wires 500, a white resin member 280, a reflector 600, a sealing resin member 700, terminals 800, electronic components 810 to 830, and a socket 900. Note that the sealing resin member 700 has been omitted from FIG. 1 for facilitating the understanding. Also, the wires 500 have been omitted from FIGS. 1 and 2.

The substrate 300 includes a base material 310 and a wiring pattern 320 formed on the base material 310. The base material 310 has a rectangular shape, and is made of, for example, glass epoxy resin. The wiring pattern 320 is made of, for example, a metal such as Cu or Ag, and includes bonding portions 321 and 322. The bonding portions 321 and 322 are formed on the obverse surface of the base material 310. Note that the illustration of the wiring pattern 320 has been omitted from FIGS. 1 and 2. Electronic components such as resistors 810, diodes 820, and capacitors 830 are mounted on the obverse surface of the substrate 300. The electronic components 810 to 830 are connected by the wiring pattern 320 to form a circuit, and serves to light the LED chips 200 in the desired emission state. Note that the type, number, and placement locations of the electronic components 810 to 830 are not limited.

The reflector 600 is made of, for example, a white resin, and is fixed to the substrate 300 so as to surround the LED chips 200. The reflector 600 serves to cause the light emitted laterally from each of the LED chips 200 to be reflected upwardly. The reflector 600 has a reflecting surface 601 formed thereon. The reflecting surface 601 surrounds the LED chips 200. In the present embodiment, the reflecting surface 601 is inclined so as to be more distant from the LED chips 200 in a direction perpendicular to the thickness direction of the substrate 300 as the reflecting surface 601 is farther away from the substrate 300 in the thickness direction of the substrate 300. That is, the reflecting surface 601 is tapered such that its cross section orthogonal to the thickness direction of the substrate 300 becomes larger toward the opening side of the reflector 600.

Each LED chip 200 is a light source of the LED illuminator 101, and emits red light, for example. In the present embodiment, five LED chips 200 are mounted on the substrate 300 so as to be surrounded by the reflector 600. As shown in FIG. 3, each LED chip 200 has a structure including a support substrate 210, a semiconductor layer 220, an electrode 230, and an electrode 240. In the LED chip 200, a semiconductor layer 220 including a stack of an n-type semiconductor layer, an active layer, and a p-type semiconductor layer each made of, for example, AlGaInP is stacked on a support substrate 210 serving as a growth substrate made of, for example, Ge. Further, an electrode 230 is formed on a surface (the surface on the lower side in FIG. 3) opposite to a surface of the support substrate 210 on which the semiconductor layer 220 is stacked, and an electrode 240 is formed on a surface (the surface on the upper side in FIG. 3) of the semiconductor layer 220 that is located opposite to the support substrate 210. The entirety of the support substrate 210 is made of an electroconductive material, so that the electrode 230 is electrically connected to the semiconductor layer 220.

The stacked structure of the LED chip 200 is not limited to the above-described structure. For example, instead of forming a layer that will serve as the semiconductor layer 220 by epitaxial growth on a substrate that will serve as the support substrate 210, a layer that will serve as the semiconductor layer 220, formed separately from a substrate that will serve as the support substrate 210, may be attached to a substrate that will serve as the support substrate 210 by thermal compression. Apart from Ge, it is possible to use GaAs, Si, SiC, GaP, or the like as the material forming the support substrate 210. Apart from AlGaInP, it is possible to use GaN, GaP, AlInP, InGaP, or the like as the material forming the semiconductor layer 220.

In the production process of the LED chips 200, portions of the semiconductor layer that are located on the border lines between adjacent LED chips 200 are removed by etching treatment after stacking the semiconductor layer by an epitaxial growth method, and the LED chip wafer is diced along the border lines, thereby being divided into LED chips 200. Accordingly, each LED chip 200 is shaped such that side surfaces of the diced support substrate 210 are located inward of the side surfaces of the semiconductor layer 220 in plan view, and the LED chip 200 as a whole, when viewed from the side, has a protruding shape (see FIG. 3) having a protruding portion on the obverse surface side. That is, each side surface of the LED chip 200 has a step formed by an edged portion 210a where each edge of the obverse surface of the support substrate 210 is exposed. Note that the obverse surface of the support substrate 210 may be flat over the entire surface, or may be slightly recessed at its peripheral portion by etching.

The LED chip 200 is mounted on the obverse surface of the substrate 300. As shown in FIG. 3, the electrode 230 is bonded to the bonding portion 321 by using a conductive paste. One end of the wire 500 is bonded to the electrode 240, and the other end of the wire 500 is bonded to the bonding portion 322. That is, the LED chip 200 is configured as a single-wire type LED chip. FIG. 4 is an enlarged view of the inside of the reflector 600 in the plan view shown in FIG. 1, with the white resin member 280 omitted therefrom. As shown in FIG. 4, the direction in which the bonding portion 322, to which the wire 500 bonded to each of the LED chips 200 is bonded, is arranged relative to the bonding portion 321, to which the LED chip 200 is mounted, is different for each of the LED chips 200.

Although the present embodiment has described a case where the LED chip 200 emits red light, the present invention is not limited thereto. The LED chip 200 may emit light of a different color as long as the side surfaces thereof have a step including the edged portion 210a described above.

The white resin member 280 is made of a resin material that appears white and does not transmit the light from the LED chip 200, and corresponds to an example of the opaque resin as used herein. As shown in FIG. 3, the white resin member 280 covers all of the side surfaces of the support substrate 210. On the other hand, the semiconductor layer 220 is not covered by the white resin member 280. A liquid white resin material before being solidified into the white resin member 280 has a suitable degree of viscosity, as will be described later. Therefore, because of the surface tension, the liquid white resin material is not likely to extend beyond the edged portion 210a when injected into a region surrounded by the reflecting surface 601 of the reflector 600 in the production process. Accordingly, by appropriately adjusting the amount of the white resin material injected, it is possible to cover all of the side surfaces of the support substrate 210, while not covering the side surfaces of the semiconductor layer 220. As can be understood from FIGS. 1 and 2, the white resin member 280 surrounds the LED chips 200, and the peripheral edge thereof extends to the reflecting surface 601 of the reflector 600. Accordingly, the region extending from each of the LED chips 200 toward the reflecting surface 601 in the up-down direction and the left-light direction in FIG. 1 is filled with the white resin member 280.

In the present embodiment, a resin obtained by compounding a silicone resin with titanium oxide at 20% is used as the white resin member 280. Note that the compounding ratio of the titanium oxide is not limited to 20%. The viscosity of the liquid white resin material varies with the viscosity of the silicone resin and the compounding ratio of the titanium oxide. When the viscosity is too high, it may be difficult to uniformly spread the liquid white resin material over the entire surface. When the viscosity is too low, the liquid white resin material may extend beyond the edged portion 210a of the support substrate 210 of the LED chip 200 to extend to the semiconductor layer 220. The higher the compounding ratio of the titanium oxide, the higher the viscosity of the liquid white resin material becomes. Therefore, it is necessary to adjust the compounding ratio according to the viscosity of the silicone resin. In the present embodiment, a silicone resin having a moderate viscosity is used, and therefore, the compounding ratio is set to 20%. In this case, the compounding ratio may be set to 15 to 25%. In the case of using a silicone resin having a low viscosity, an appropriate viscosity is achieved when the compounding ratio is set to 30 to 50%. In the case of using a silicone resin having a high viscosity, an appropriate viscosity is achieved when the compounding ratio is set to 5 to 25%. That is, an appropriate viscosity can be achieved by adjusting the compounding ratio within the range of 5 to 50% according to the viscosity of the silicone resin. The material of the white resin member 280 is not limited to the material described above.

The sealing resin member 700 covers the LED chips 200, and fills the space surrounded by the reflecting surface 601. The sealing resin member 700 is made of, for example, a transparent epoxy resin. In the present embodiment, the sealing resin member 700 is formed so as not to protrude from the opening of the reflector 600, but the present invention is not limited thereto. For example, the sealing resin member 700 may be solidified while being raised from the opening of the reflector 600, and may be caused to function as a lens.

Each terminal 800 is a metal wire that will serve as an electrode, and is provided so as to extend through the substrate 300 and the socket 900. One end of the terminal 800 is connected to a portion of the wiring pattern 320 by soldering, for example.

The socket 900 is a component for mounting the substrate 300 for attachment to an automobile, for example. The socket 900 is made of, for example, a synthetic resin, and is formed by injection molding, for example. The socket 900 includes a mount portion 910 for mounting the substrate 300, and an attachment portion 920 for attachment. The mount portion 910 has a cylindrical shape that is open at one end (the upper end in FIG. 2), and the substrate 300 is mounted on the inner bottom surface of the mount portion 910. A heat dissipation plate 950, which is, for example, a circular plate made of aluminum, is fixed to the inner bottom surface of the mount portion 910. The substrate 300 is mounted on the mount portion 910 of the socket 900 by bonding the reverse surface of the substrate 300 to the obverse surface of the heat dissipation plate 950 by using an adhesive.

Next, an example of a method of making the LED illuminator 101 will be described with reference to FIGS. 5 and 6. Note that FIGS. 5 and 6 are simplified illustrations, showing enlarged views in which only one LED chip 200 is mounted.

Figure 5A:
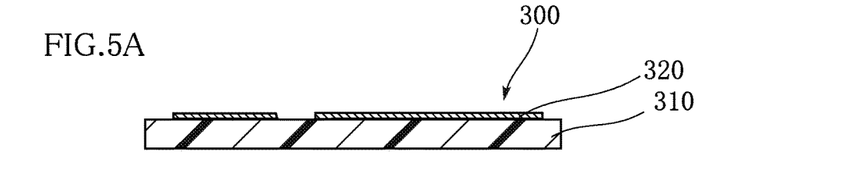
FIGS. 5A to 5F are diagrams showing an example of a method for producing the LED illuminator shown in FIG. 1.
Figure 5B:
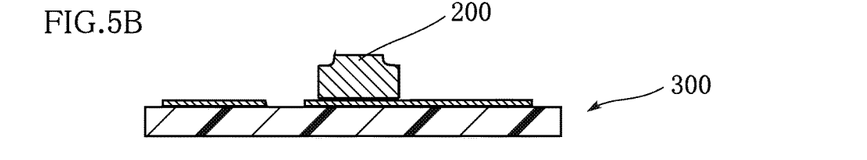
Figure 5C:
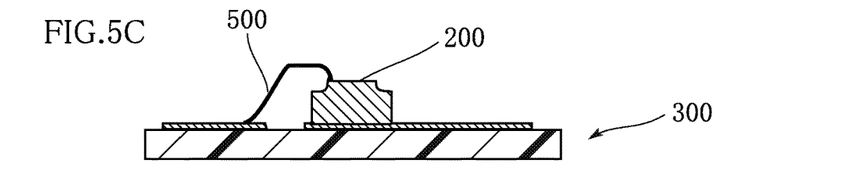
Figure 5D:
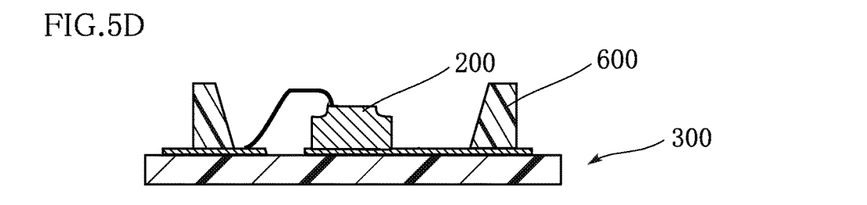
Figure 6A:
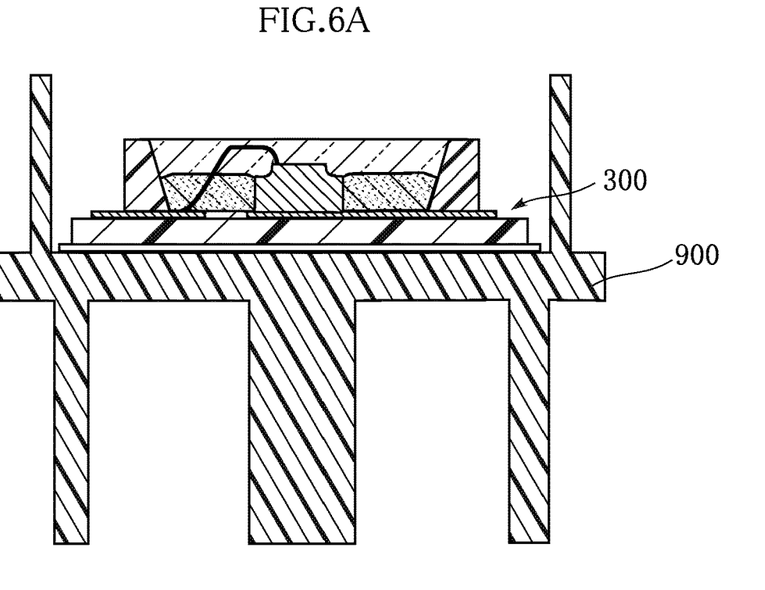
FIGS. 6A and 6B are diagrams showing an example of a method for producing the LED illuminator shown in FIG. 1.
Figure 6B:
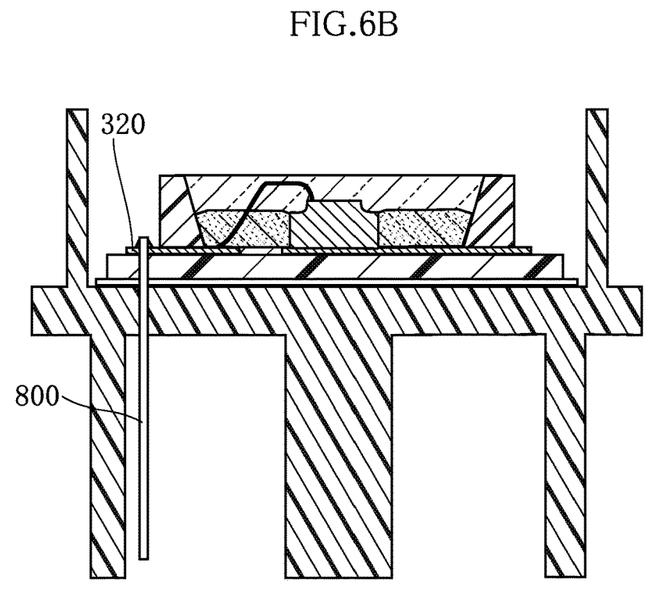

First, a wiring pattern 320 is formed on a base material 310, to form a base substrate 300 (see FIG. 5A). Then, an LED chip 200 is mounted on the substrate 300 (see FIG. 5B). At this time, electronic components, which are not shown, are also mounted. Then, a wire 500 is bonded to the LED chip 200 (see FIG. 5C). Then, a reflector 600 is formed on the substrate 300 so as to surround the LED chip 200 (see FIG. 5D). Here, the reflector 600 may be formed before the LED chip 200 is mounted on the substrate 300, or the wire 500 may be bonded to the LED chip 200 after the reflector 600 is formed.

Figure 5E:
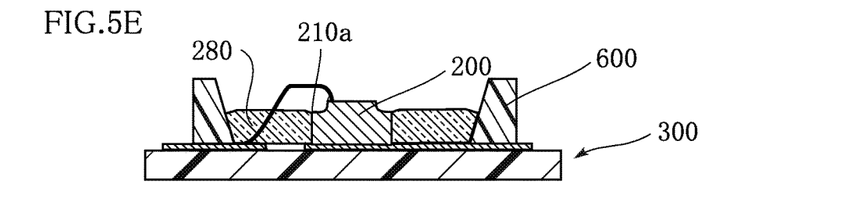

Then, a liquid white resin material is injected and solidified, to form a white resin member 280 (see FIG. 5E). By appropriately adjusting the viscosity and amount of the white resin material injected, the white resin material is prevented from extending beyond the edged portion 210a of the support substrate 210 of the LED chip 200, and can be uniformly spread over the obverse surface of the substrate 300 surrounded by the reflector 600. Although it is desirable that the white resin material extends to the edged portion 210a on all of the four side surfaces of the LED chip 200, part of the side surfaces of the support substrate 210 can be shielded by the white resin member 280 even if the white resin material does not extend to the edged portion 210a. To enhance the wet spreadability of the white resin material, argon plasma may be applied to the white resin material before injecting the white resin material.

Figure 5F:
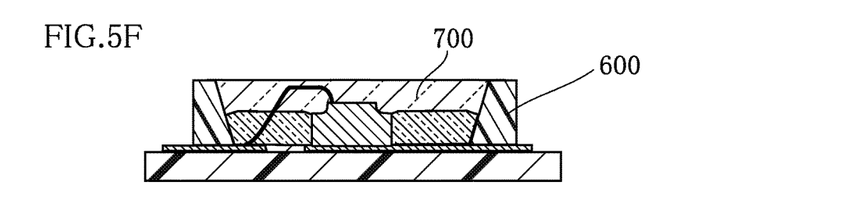

Then, a sealing resin member 700 is formed (see FIG. 5F). Then, the substrate 300 is mounted on a socket 900 (see FIG. 6A). Then, a hole extending through the substrate 300 and the socket 900 is formed in a predetermined position of the wiring pattern 320, a terminal 800 is inserted from the hole, and one end of the terminal 800 is connected to the wiring pattern 320 (see FIG. 6B), whereby an LED illuminator 101 is completed. Here, instead of forming the hole after the socket 900 is attached to the substrate 300, a hole may be formed in advance in a predetermined position of each of the substrate 300 and the socket 900.

Next, advantages of the LED illuminator 101 will be described.

According to the present embodiment, of the light from the semiconductor layer 220, light beams traveling toward the side surfaces of the support substrate 210 are shielded by the white resin member 280. This makes it possible to inhibit these light beams from being absorbed by the support substrate 210. Moreover, the white resin member 280 has a higher reflectivity than, for example, Ge, and thus suitably reflects the light from the semiconductor layer 220. Accordingly, of the light emitted from the LED chip 200, the amount of light beams emitted from the sealing resin member 700 can be increased, making it possible to enhance the brightness of the LED illuminator 101.

Since a resin obtained by compounding a silicone resin having a moderate viscosity with titanium oxide at 20% is used for the white resin member 280, an appropriate viscosity can be expected during the injection step of the production process. Accordingly, the liquid resin material can be easily spread over the obverse surface of the substrate 300 surrounded by the reflector 600, and can be easily injected so as not to extend beyond the edged portion 210a of the support substrate 210 of the LED chip 200. This can facilitate the injection step, and also can suppress the occurrence of a product failure.

The white resin member 280 covers the entire annular region extending from the support substrate 210 of the LED chip 200 to the reflecting surface 601 of the reflector 600. Accordingly, the region surrounded by the reflecting surface 601 is covered by the white resin member 280, except for the portion occupied by the LED chip 200. Accordingly, it is possible to reflect a larger amount of light from the semiconductor layer 220 of the LED chip 200. This is preferable for enhancing the brightness of the LED illuminator 101. Also, a treatment for suitably reflecting light does not need to be separately performed on the region of the substrate 300 that is surrounded by the reflecting surface 601.

The provision of the reflector 600 including the reflecting surface 601 makes it possible to more brightly illuminate an area in a direction immediately above the LED illuminator 101.

Since the direction in which the bonding portion 322 is arranged relative to the corresponding bonding portion 321 on which the LED chip 200 is mounted is different for each of the LED chips 200 (see FIG. 4), it is possible to inhibit an injecting nozzle from coming into contact with the wire 500 at the time of injecting the liquid white resin material into the reflector 600 in the production process.

Figure 7:
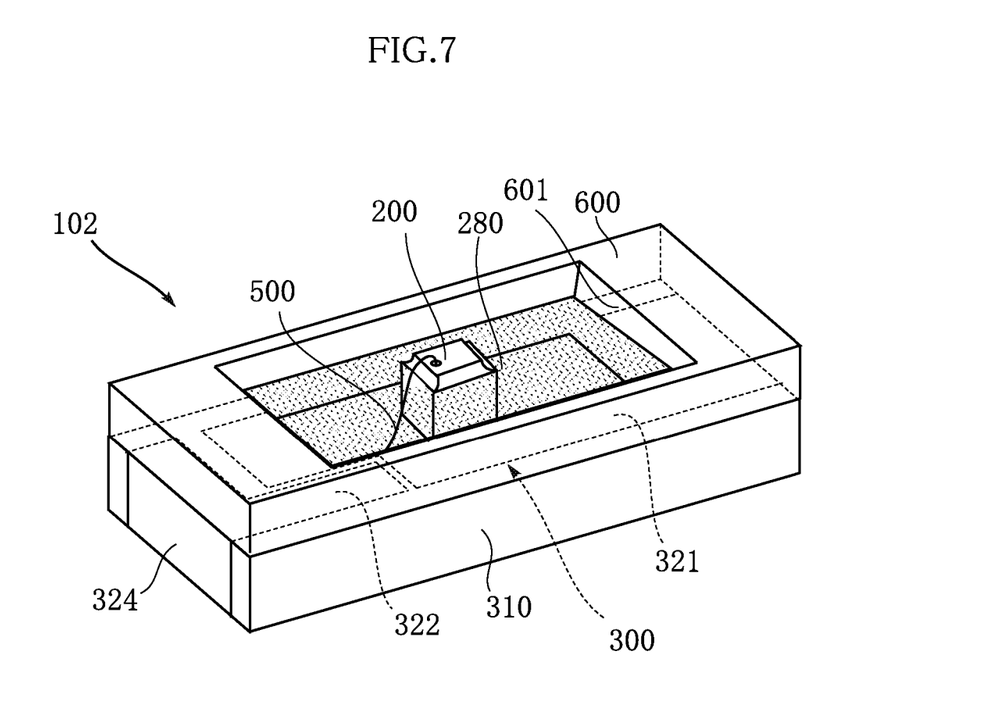
FIG. 7 is a perspective view showing an LED illuminator according to a second embodiment of the present invention.
Figure 8:
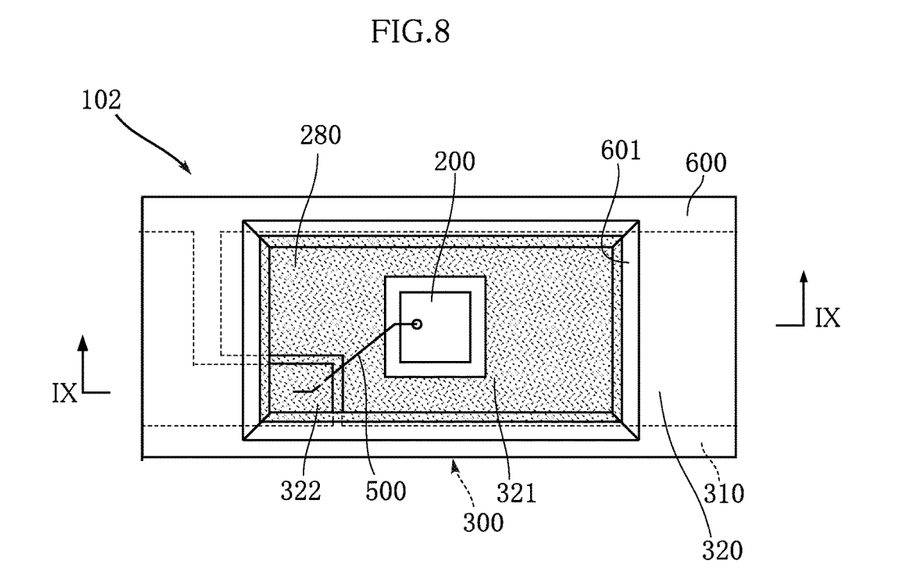
FIG. 8 is a plan view showing the LED illuminator shown in FIG. 7.
Figure 9:
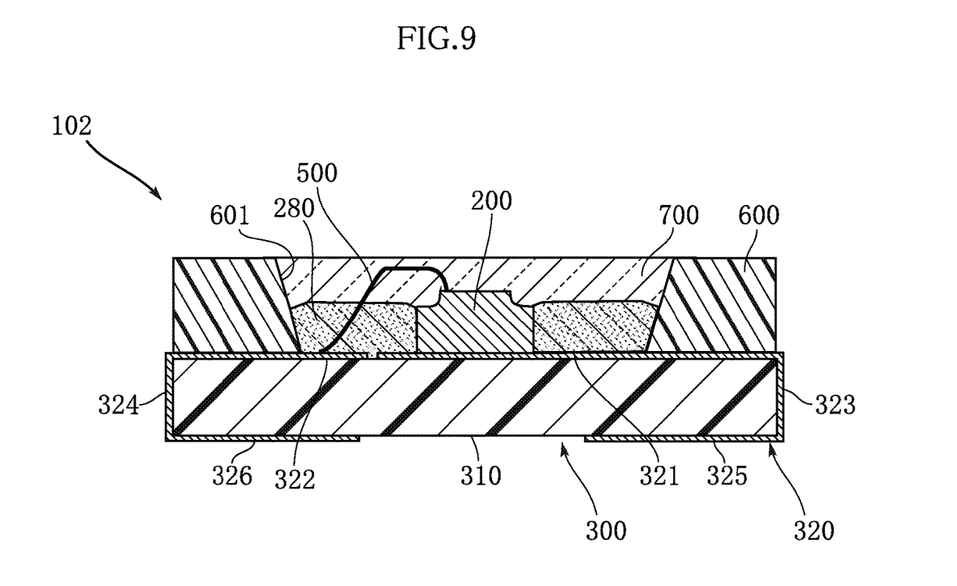
FIG. 9 is a cross-sectional view taken along the line IX-IX in FIG. 8.

FIGS. 7 to 9 show another embodiment of the present invention. Note that elements that are the same as or similar to the elements in the above-described embodiment are denoted by the same reference numeral in these drawings.

FIGS. 7 to 9 show an LED illuminator according to a second embodiment of the present invention. FIG. 7 is a perspective view showing the LED illuminator. FIG. 8 is a plan view showing the LED illuminator. FIG. 9 is a cross-sectional view taken along the line IX-IX in FIG. 8. Note that a sealing resin member 700 has been omitted from FIGS. 7 and 8 for facilitating the understanding.

An LED illuminator 102 of the present embodiment is mounted on a circuit board, for example, as an LEDmodule, and is different from the LED illuminator 101 described above in that it does not include the socket 900 and the other electronic components 810 to 830, and the shape of the wiring pattern 320 is changed such that a portion of the wiring pattern 320 is used as mount terminals 325 and 326 replacing the terminals 800. The present embodiment describes a case where only one LED chip 200 is mounted on the substrate 300. Note that the number of LED chips 200 mounted is not limited.

The wiring pattern 320 includes bypass portions 323 and 324 that are connected to the bonding portions 321 and 322 and are formed on opposite side surfaces of the base material 310, and mount terminals 325 and 326 that are connected to the bypass portions 323 and 324 and are formed on the reverse surface of the base material 310. The mount terminals 325 and 326 are used to mount the LED illuminator 102 on a circuit board, for example.

With this embodiment as well, it is possible to enhance the brightness of the LED illuminator 102.

The LED illuminator and the method for producing the same according to the present invention are not limited to the embodiments described above. Various design modifications can be made for the specific configuration of the portions of the LED illuminator and the method for producing the same according to the present invention.

The invention claimed is:

1. An LED illuminator, comprising:
at least one LED chip including a first LED chip; and
an opaque resin member that does not transmit light from the LED chip,
wherein the LED chip includes: a support substrate having an obverse surface, a reverse surface and a side surface located between the obverse surface and the reverse surface; a semiconductor layer disposed on the obverse surface of the support substrate; and a first electrode formed on the reverse surface of the support substrate,
the obverse surface of the support substrate has a peripheral edge portion exposed from the semiconductor layer,
the opaque resin member covers at least a part of the side surface of the support substrate and exposing the peripheral edge portion of the obverse surface,
the semiconductor layer has a curved surface located at an end of the semiconductor layer in plan view, the curved surface being curved in a recessed shape in a cross-sectional view taken along a plane that is parallel to a thickness direction of the semiconductor layer,
the semiconductor layer has a first surface and a second surface that faces a side opposite the first surface, the second surface of the semiconductor layer being disposed between the first surface of the semiconductor layer and the obverse surface of the support substrate, the first surface of the semiconductor layer is smaller in dimension in a lateral direction perpendicular to the thickness direction than the second surface of the semiconductor layer,
the LED chip includes a second electrode that is disposed on the first surface of the semiconductor layer,
the first surface of the semiconductor layer includes an exposed portion that is exposed from the second electrode,
the curved surface of the semiconductor layer includes a first end and a second end, the first end of the curved surface being connected to the first surface of the semiconductor layer, the second end of the curved surface being connected to the obverse surface of the support substrate, and
a dimension of the exposed portion of the first surface of the semiconductor layer in the lateral direction is larger than a distance between the first end of the curved surface and the second end of the curved surface in the lateral direction.

2. The LED illuminator according to claim 1, wherein an entirety of the support substrate is electroconductive.

3. The LED illuminator according to claim 1, wherein the opaque resin member is white.

4. The LED illuminator according to claim 1, wherein the opaque resin member is made of a silicone resin containing titanium oxide.

5. The LED illuminator according to claim 4, wherein the opaque resin member comprises 5 to 50% of the titanium oxide.

6. The LED illuminator according to claim 4, wherein the opaque resin member comprises 20% of the titanium oxide.

7. The LED illuminator according to claim 1, wherein the opaque resin member covers an entirety of the side surface of the support substrate.

8. The LED illuminator according to claim 1, wherein the semiconductor layer emits red light.

9. The LED illuminator according to claim 1, further comprising a base substrate including a base material and a wiring pattern, wherein the first LED chip is mounted on the base substrate.

10. The LED illuminator according to claim 9, wherein the first electrode is electrically connected to the wiring pattern.

11. The LED illuminator according to claim 10, further comprising a plurality of terminals arranged in the lateral direction, each of the terminals being electrically connected to the wiring pattern,
wherein each of the terminals is circular in plan view.

12. The LED illuminator according to claim 10, wherein the curved surface of the semiconductor layer is connected to the first and second surfaces of the semiconductor layer,
the curved surface of the semiconductor layer is disposed between the first and second surfaces of the semiconductor layer in the thickness direction,
and
the wire is bonded on the first surface of the semiconductor layer via the second electrode.

13. The LED illuminator according to claim 9, further comprising a terminal electrically connected to the wiring pattern.

14. The LED illuminator according to claim 9, further comprising a wire, wherein the second electrode and the wiring pattern are electrically connected to each other by the wire.

15. The LED illuminator according to claim 1, further comprising a second LED chip, a first wire connected to the first LED chip, and a second wire connected to the second LED chip, wherein a direction in which the first wire extends from the first LED chip in plan view is different from a direction in which the second wire extends from the second LED chip in plan view.

16. The LED illuminator according to claim 1, further comprising a reflector and a light-transmitting sealing resin member, wherein the reflector has a reflecting surface surrounding the first LED chip, and the light-transmitting sealing resin member covers the semiconductor layer.

17. The LED illuminator according to claim 16, wherein the light-transmitting sealing resin member covers the peripheral edge portion of the obverse surface.

18. The LED illuminator according to claim 16, wherein the opaque resin member has a top surface, the whole top surface of the opaque resin member being held in contact with the light-transmitting sealing resin member,
the top surface of the opaque resin member includes an edge held in contact with the side surface of the support substrate,
the side surface of the support substrate includes a part exposed from the top surface of the opaque resin, and
the edge of the top surface is located at a lower position in the thickness direction than both the peripheral edge portion of the obverse surface and the curved surface of the semiconductor layer.

19. The LED illuminator according to claim 18, wherein the top surface of the opaque resin member includes a first portion, and
the first portion of the top surface is located at a higher position in the thickness direction than both the peripheral edge portion of the obverse surface and the second surface of the semiconductor substrate, and overlaps the curved surface of the semiconductor layer in the thickness direction.

20. The LED illuminator according to claim 16, further comprising two diodes, and wherein, in plan view, each of the reflector and one of the at least one LED chip is disposed between the two diodes.

21. The LED illuminator according to claim 20, wherein each of the two diodes include a first edge and a second edge that is larger in dimension in plan view than the first edge, and
in plan view, the first edge of one of the two diodes is perpendicular to the first edge of the other one of the two diodes.

22. The LED illuminator according to claim 16, wherein the curved surface of the semiconductor layer is exposed from the opaque resin, and held in contact with the light-transmitting sealing resin member.

23. The LED illuminator according to claim 1, wherein the at least one LED chip includes five LED chips, and in plan view, one of the five LED chips is disposed between two others of the five LED chips and between the other two others of the five LED chips.

24. The LED illuminator according to claim 1, wherein a center of the second electrode in the lateral direction is offset in the lateral direction from a center of the first surface of the semiconductor layer in the lateral direction.

* * * * *